United States Patent
Bhatt et al.

[11] Patent Number: 5,953,594
[45] Date of Patent: Sep. 14, 1999

[54] METHOD OF MAKING A CIRCUITIZED SUBSTRATE FOR CHIP CARRIER STRUCTURE

[75] Inventors: Anilkumar Chinuprasad Bhatt, Johnson City; Thomas Richard Miller, Endwell; Allen Frederick Moring, Vestal, all of N.Y.; James Paul Walsh, Vandling, Pa.

[73] Assignee: International Business Machines Corporation, Armonk, N.Y.

[21] Appl. No.: 08/820,995

[22] Filed: Mar. 20, 1997

[51] Int. Cl.⁶ .................................................. H01L 21/44
[52] U.S. Cl. ...................... 438/125; 438/119; 438/122; 257/703; 257/706
[58] Field of Search .................................... 438/118, 119, 438/122, 125, FOR 369; 257/698, 706, 707; 361/760, 761, 762

[56] References Cited

U.S. PATENT DOCUMENTS

| | | | |
|---|---|---|---|
| 4,211,563 | 7/1980 | Goldman | 430/286 |
| 4,237,210 | 12/1980 | Dougherty | 430/318 |
| 4,259,421 | 3/1981 | Goldman | 430/5 |
| 4,773,955 | 9/1988 | Mabuchi et al. | 156/257 |
| 4,985,601 | 1/1991 | Hagner | 174/261 |
| 5,022,960 | 6/1991 | Takeyama et al. | 216/13 |
| 5,048,179 | 9/1991 | Shindo et al. | 29/840 |
| 5,098,526 | 3/1992 | Bernhardt | 205/125 |
| 5,102,829 | 4/1992 | Cohn | 438/118 |
| 5,137,618 | 8/1992 | Burnett et al. | 205/125 |
| 5,142,448 | 8/1992 | Kober et al. | 361/751 |
| 5,144,534 | 9/1992 | Kober | 361/751 |
| 5,175,060 | 12/1992 | Enomoto et al. | 428/620 |
| 5,209,817 | 5/1993 | Ahmad et al. | 216/18 |
| 5,285,352 | 2/1994 | Pastore et al. | 361/707 |
| 5,288,542 | 2/1994 | Cibulsky | 428/209 |
| 5,397,917 | 3/1995 | Ommen et al. | 257/698 |
| 5,422,513 | 6/1995 | Marcinkiewicz et al. | 257/668 |
| 5,542,175 | 8/1996 | Bhatt et al. | . |
| 5,599,747 | 2/1997 | Bhatt et al. | . |
| 5,798,909 | 8/1998 | Bhatt et al. | . |

*Primary Examiner*—Olik Chaudhuri
*Assistant Examiner*—Alonzo Chambliss
*Attorney, Agent, or Firm*—Lawrence R. Fraley

[57] ABSTRACT

An improved method of making a circuitized substrate which may be utilized as a chip carrier structure. The method involves the steps of providing a dielectric member and partially routing this member to define a temporary support portion therein. Metallization and circuitization may then occur, following which the temporary support portion is removed, and at least one added layer of metallization is then applied to assure an entirely conductive opening between the member's opposing surfaces. The temporary support assures effective support for the dry film photoresist used as part of the circuitization process. Thus, the photoresist is capable of being applied in sheetlike form for spanning the relatively small openings of the dielectric without sagging, bowing, etc., which may adversely impact subsequent processing steps. As taught herein, the entire sidewall portions defining the opening previously occupied by the temporary support portion are metallized to provide enhanced electrical characteristics for the finished product.

21 Claims, 8 Drawing Sheets

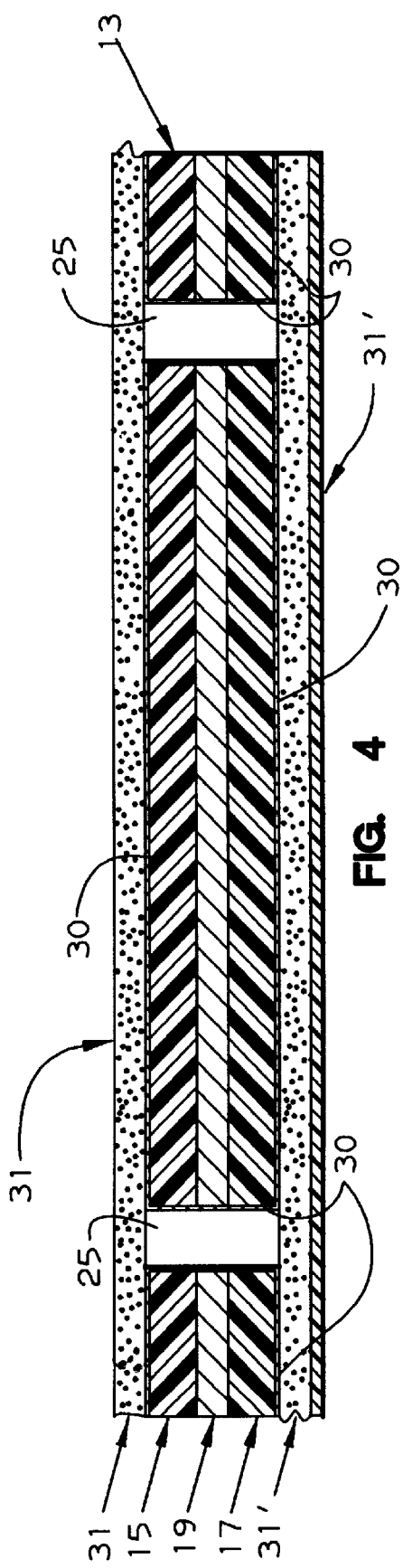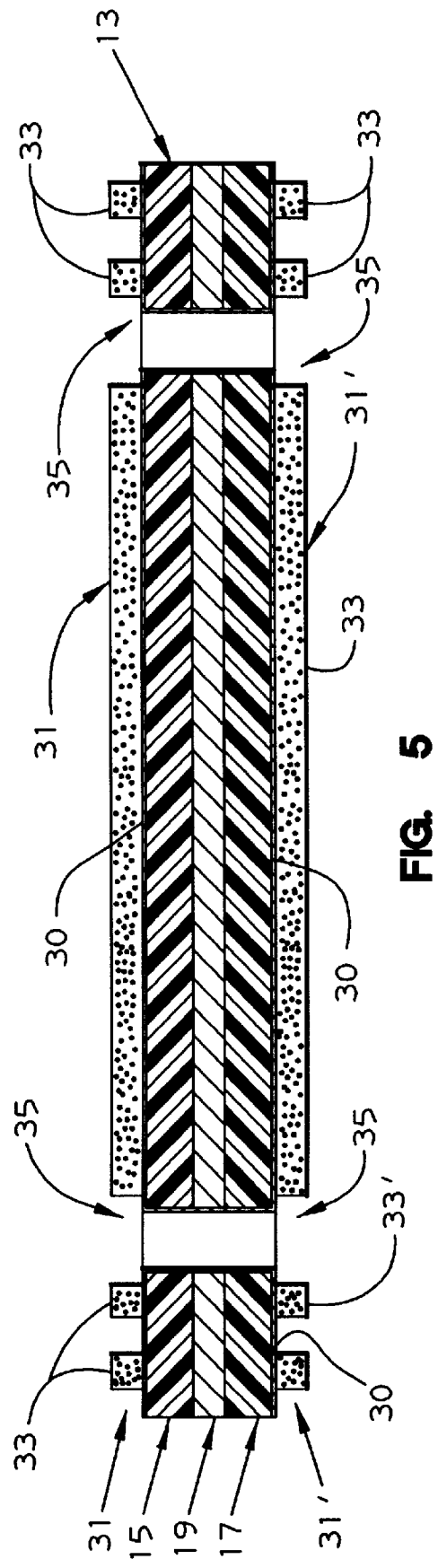

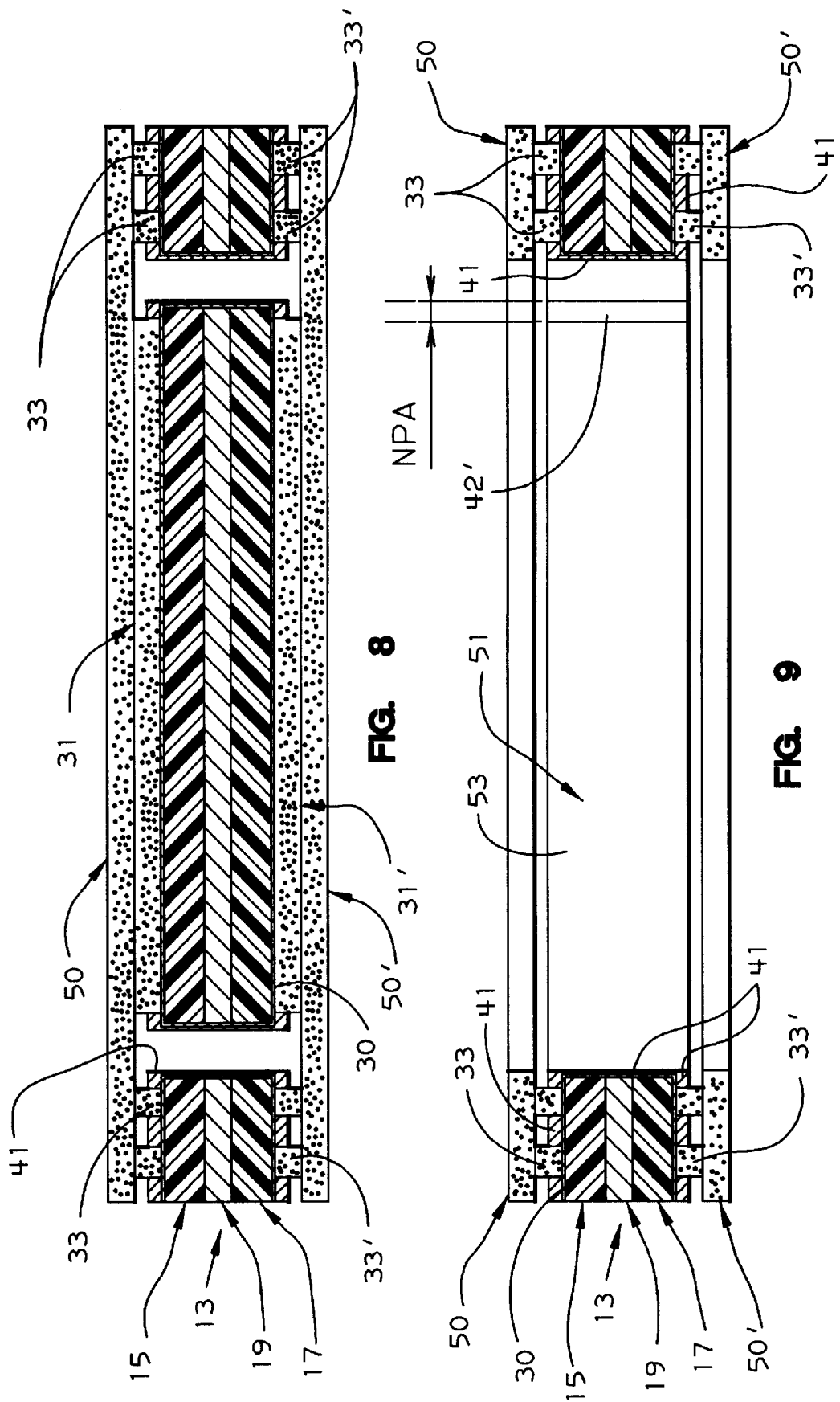

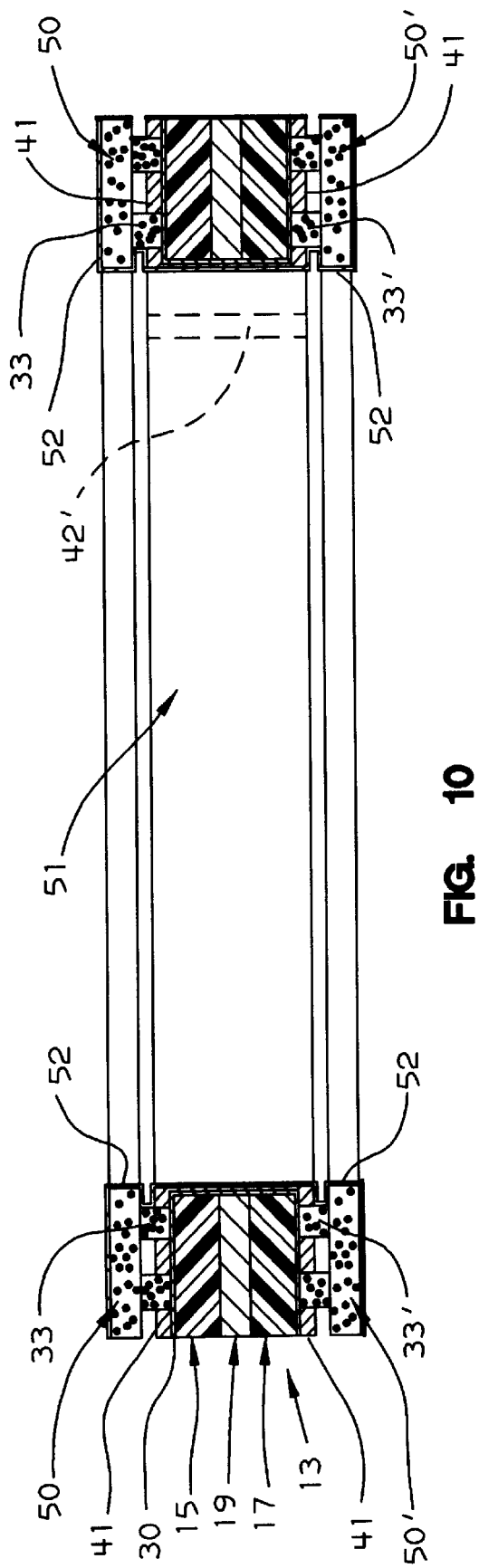
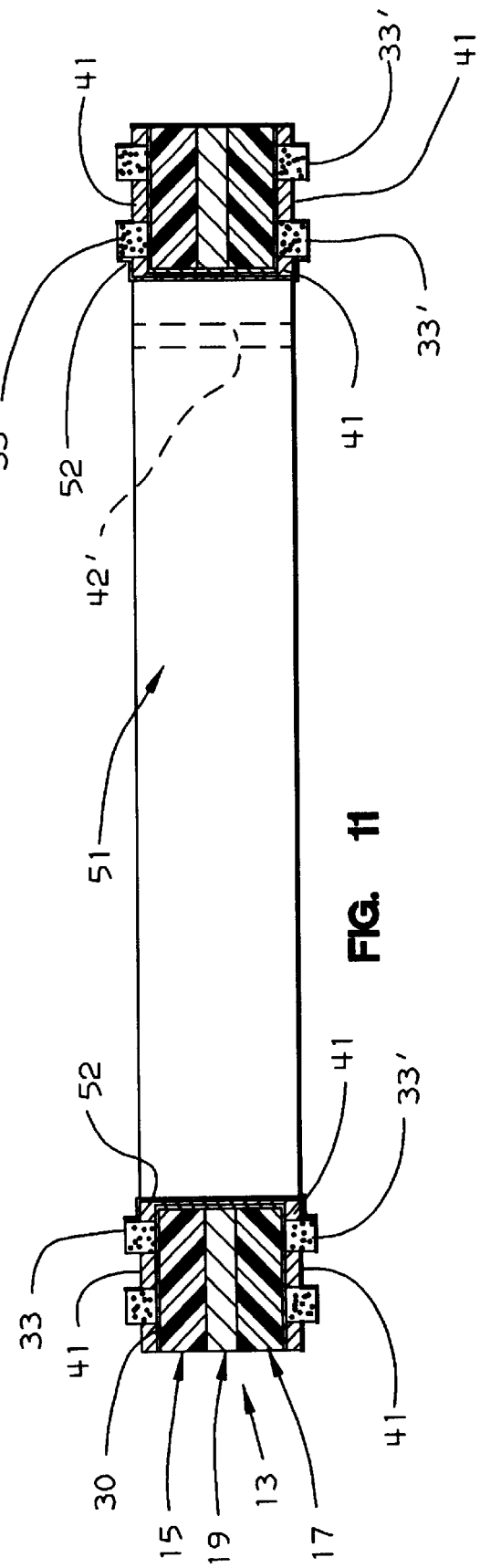
FIG. 10
FIG. 11

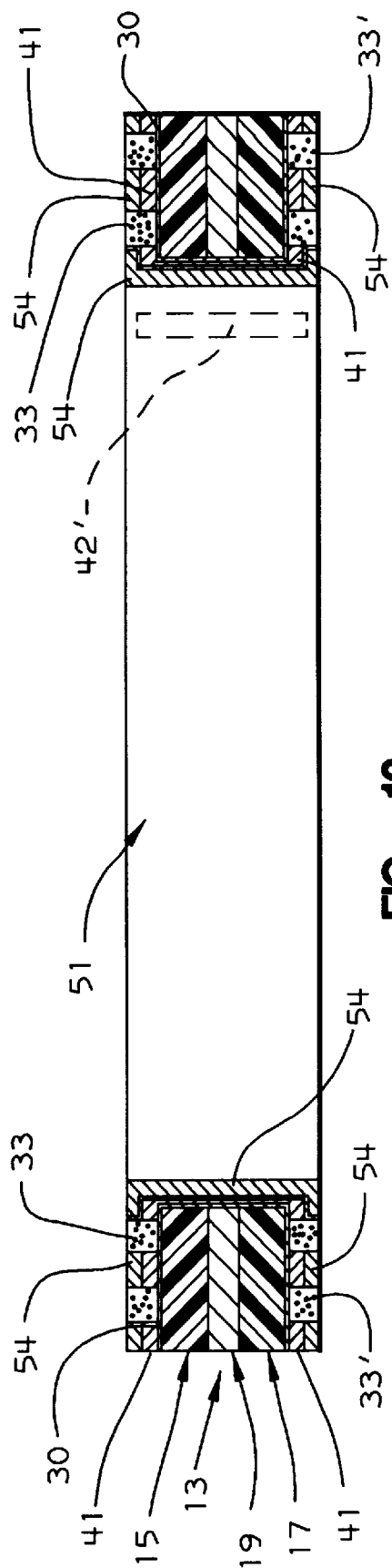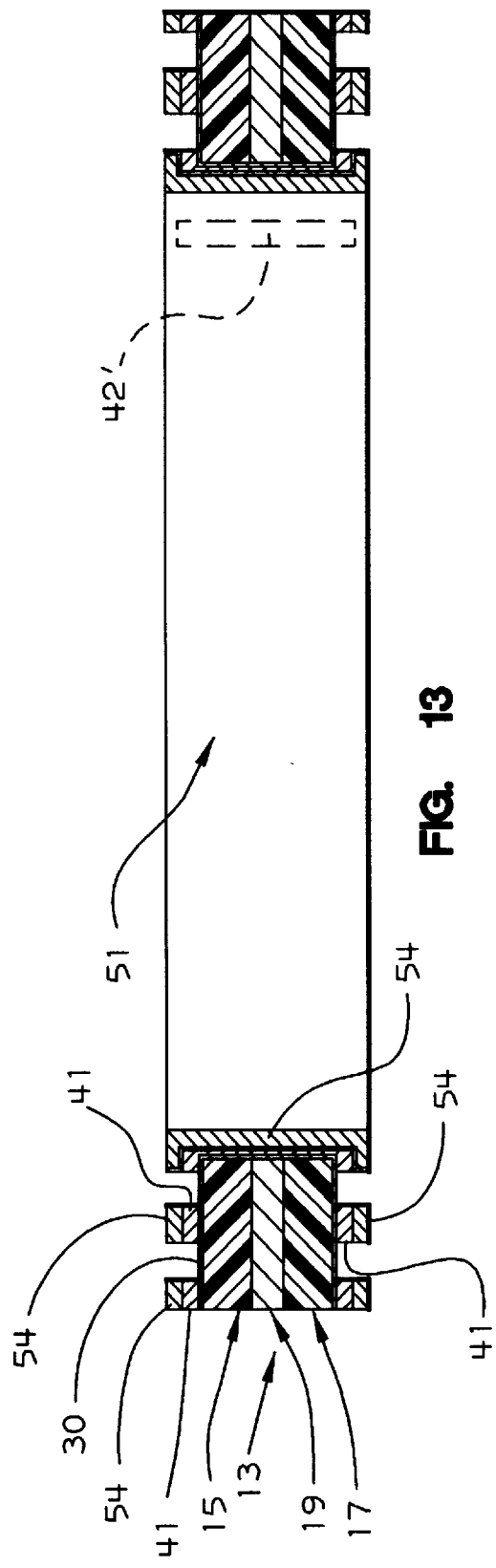

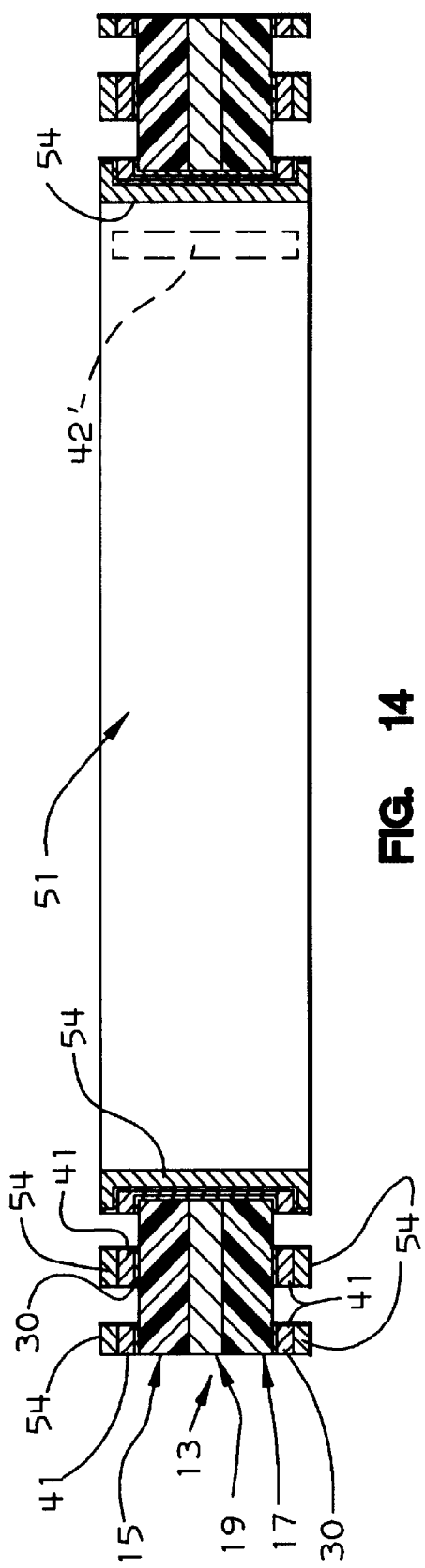
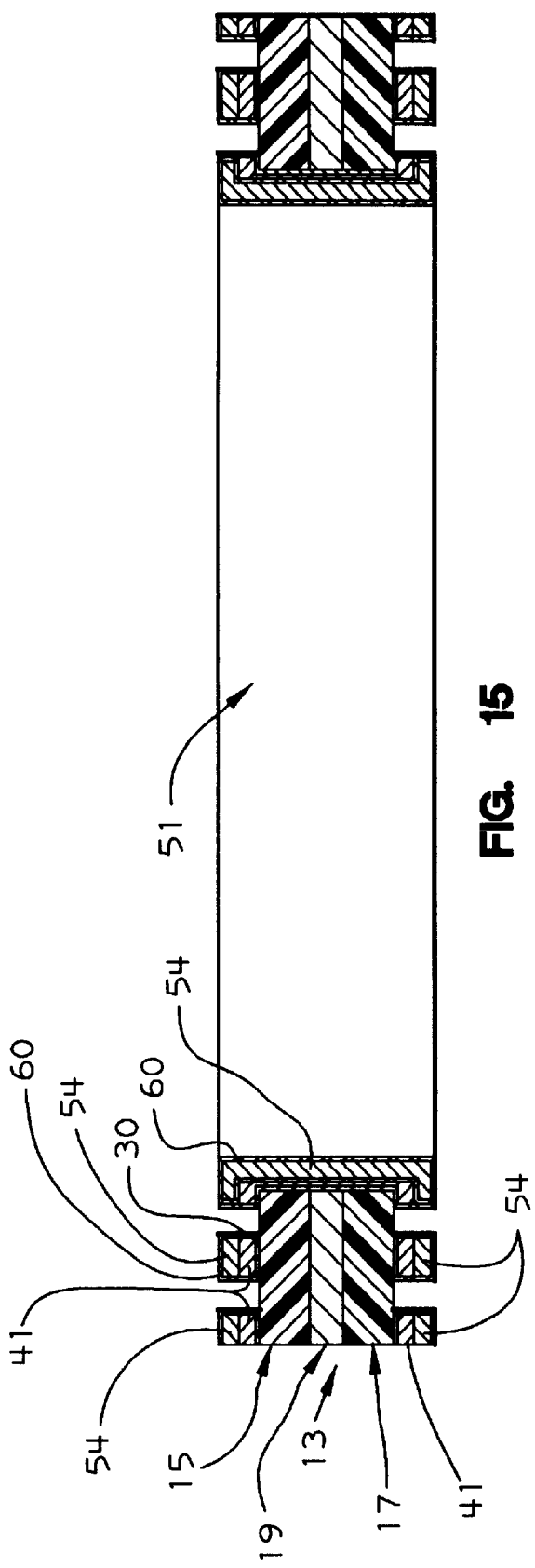

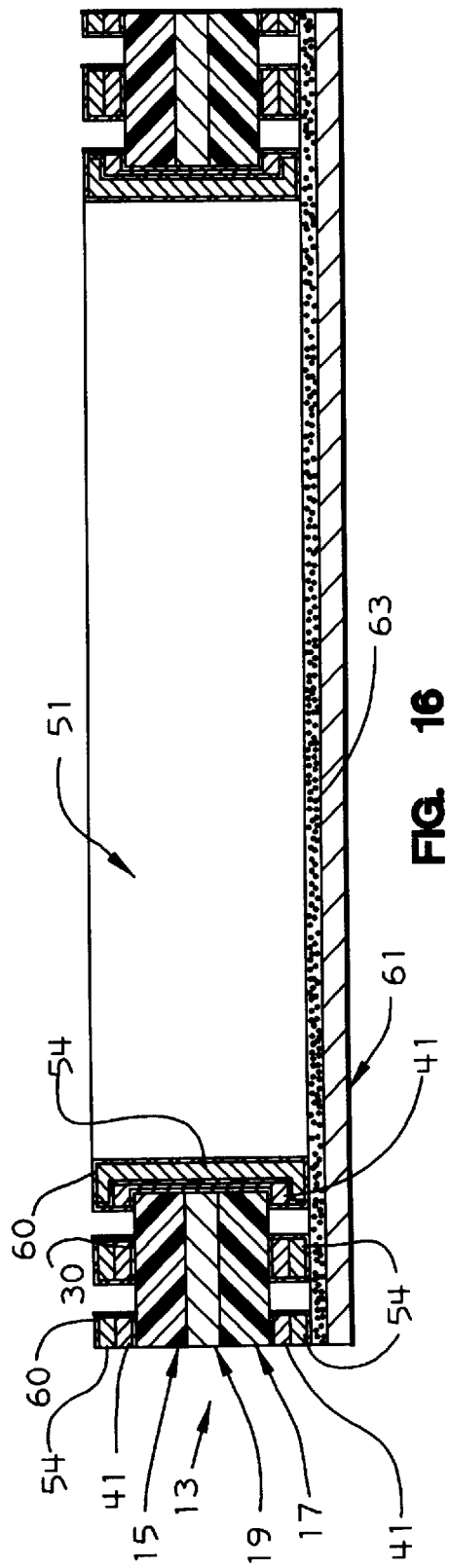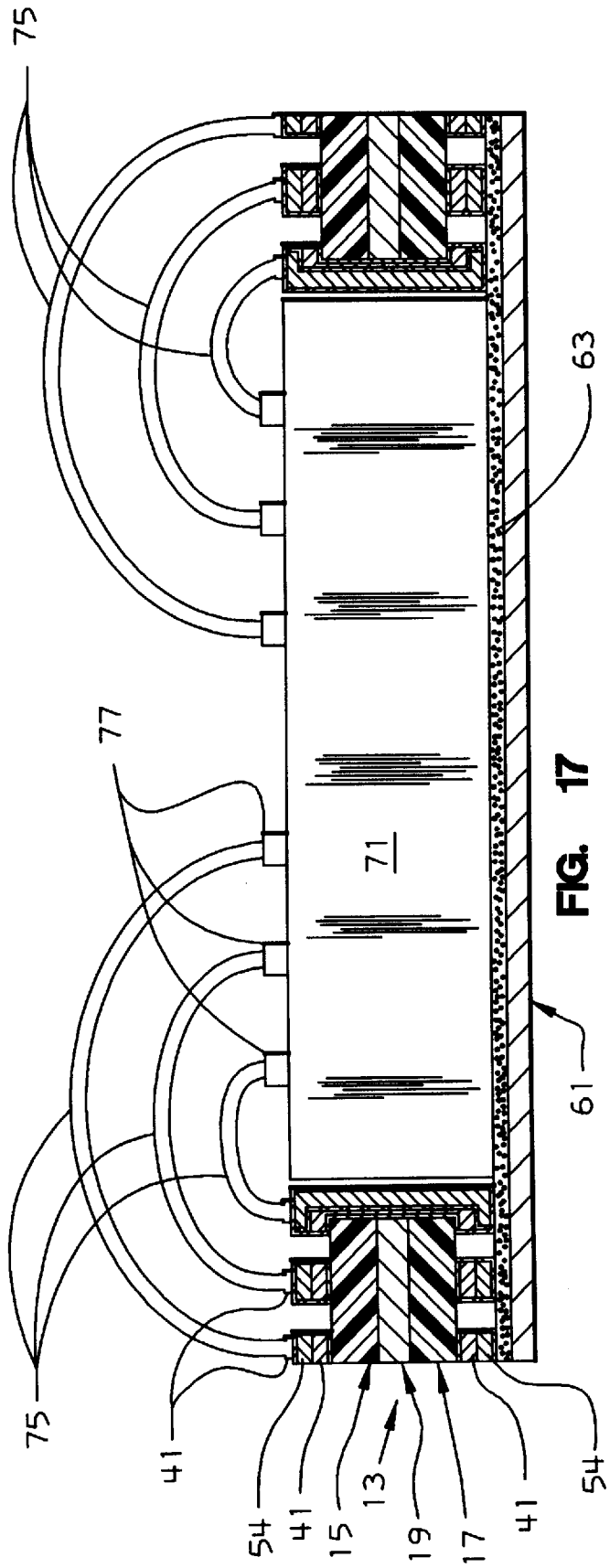

METHOD OF MAKING A CIRCUITIZED SUBSTRATE FOR CHIP CARRIER STRUCTURE

TECHNICAL FIELD

The invention pertains generally to circuitized substrates and particularly to chip carriers for integrated circuits (semiconductor chips).

CROSS-REFERENCE TO COPENDING APPLICATIONS AND PATENTS

In Ser. No. (S.N.) 08/495,248, now U.S. Pat. No. 5,599,747, entitled "Method Of Making Circuitized Substrate" and filed Jun. 27, 1995, there is defined a process for making a circuitized substrate wherein a temporary support portion is formed and removed, leaving at least of the formed cavity's sidewalls not including metallization thereon following the removal. It shall be understood that the instant Application represents an improvement to Ser. No. 08/495,248.

In Ser. No. 08/359,491, now U.S. Pat. No. 5,542,175, entitled "Method Of Laminating And Circuitizing Substrates Having Openings Therein" and filed Dec. 20, 1994, there is defined a method of laminating two substrates and circuitizing at least one of these. A plug is provided and shaped to fit within an opening defined in the structure, and then removed following lamination and circuitization.

In Ser. No. 08/390,344, entitled "Organic Chip Carriers For Wire Bond-Type Chips", filed Fer. 15, 1995, there is defined a chip carrier having a single-tiered cavity within a dual layered (of organic material) substrate and a semiconductor chip located in the cavity. The chip is wire bonded to circuitry on the substrate. The method claimed in the present Application may be used to make a chip carrier of the type defined in Ser. No. 08/390,344.

In Ser. No. 08/470,389, now U.S. Pat. No. 5,566,448, entitled "Method Of Construction Of Multi-Tiered Cavities Used In Laminate Carriers", Jun. 6, 1995, there is defined a method of forming a chip module wherein a rigid cap and substrate are used, the cap and substrate laminated together with bond pads connected to circuitry disposed in a bottomed cavity of the cap. Following cap circuitization, part of the cap (that over the cavity) is removed and a semiconductor chip coupled to the circuitry.

The above pending application and patents are assigned to the same assignee as the present invention. The teachings of these documents are incorporated herein by reference.

BACKGROUND OF THE INVENTION

It is known that integrated circuit devices (hereinafter referred to as semiconductor chips) are typically electronically packaged by mounting one or more chips onto a ceramic, e.g., alumina, circuitized substrate (referred to as a chip carrier), with wire bonds used to electrically connect I/O (input/output) contact pads on each chip to corresponding contact pads (and therefore to corresponding fan-out circuitry) on the circuitized chip carrier substrate. Wire bonding is a well known process in the art and further description is not believed necessary. The resulting chip carrier is then typically mounted on a printed circuit board (PCB) and, using circuitry on the PCB, electrically coupled to other such chip carriers and/or other electronic components mounted on the PCB.

Ceramic chip carrier structures have proven extremely useful in the electronic packaging field. However, the use of ceramic as the dielectric material of the substrate does present certain limitations and drawbacks. For example, the speed of propagation of an electrical signal through a conductive wire located on a dielectric layer (or between two dielectric layers for that matter) is proportional to the inverse of the square root of the dielectric constant of the dielectric material layer or layers. As is known, the dielectric constants of most ceramics are relatively large, e.g., the dielectric constant of alumina (the primary constituent of ceramic materials used in these substrates) is relatively high, which results in ceramic chip carriers exhibiting relatively low signal propagation speeds in comparison to substrates of other (e.g., organic) materials, such as fiberglass-reinforced epoxy resin, polytetrafluoroethylene, etc.

Ceramic chip carrier usage also presents certain I/O constraints. For example, a single-layer ceramic chip carrier substrate includes but a single layer of fan-out circuitry on the upper surface of the ceramic substrate, extending to contact pads around the outer periphery of the substrate. A lead frame, having inner leads connected to these peripheral contact pads, is typically used to electrically connect such a ceramic chip carrier to a PCB. As the number of chip I/Os has increased (in response to more recent enhanced design requirements), it has been necessary to increase the wiring density, sometimes to the point where undesirable cross-talk between adjacent wires may occur. Further, it has become increasingly difficult to form a correspondingly large number of contact pads around the outer periphery of the ceramic substrate. Accordingly, it is understood that single-layer ceramic chip carrier substrates are limited in the ability thereof to accommodate semiconductor chips with significantly increased I/O counts as demanded in many of today's designs.

Efforts to accommodate semiconductor chips having relatively large numbers of I/O pads have led to the use of multilayer ceramic chip carrier substrates utilizing what are referred to as "ball grid arrays" (BGAs) in lieu of lead frames. Such multilayer types of ceramic chip carrier substrates differ from single-layer ceramic chip carrier substrates in that these include two or more layers of fan-out circuitry on two or more ceramic layers. Significantly, these layers of fan-out circuitry are electrically interconnected by mechanically drilled holes (called "vias"), which are plated and/or filled with electrically conductive material (e.g., copper). In addition, a certain number of such holes extend from the layers of fan-out circuitry to respective lands on the chip carrier substrates, on which are mounted solder balls (formed in grid arrays, hence the term "ball grid array"). These solder balls are intended to be mechanically and electrically connected to corresponding solderable contact pads on a receiving substrate, e.g., PCB. Unfortunately, the mechanically drilled holes electrically interconnecting the layers of fan-out circuitry have relatively large diameters, requiring the spacing between the fan-out wires to be relatively large. This relatively large spacing between fan-out wires understandably limits the number of chip I/O pads which can be accommodated by such multilayered substrates.

Additional efforts to package chips having a relatively large number of chip I/O pads have led to the use of multi-tiered cavities in multi-layered ceramic substrates. (As used herein, the term "cavity" denotes a depression in a substrate, not a hole or opening extending entirely through the substrate's thickness.) When using such a packaging configuration, a chip is mounted face-up (its I/O pads facing upwardly) at the bottom of a multi-tiered cavity. Wire bonds (e.g., using fine gold wire) are extended from the I/O contact pads on the exposed upper surface of the chip to respective contact pads on the exposed upper surfaces of the different layers of the multi-layered ceramic substrate. While this configuration does make it possible to accommodate a relatively large number of chip I/O pads, it unfortunately typically mandates usage of multiple manufacturing set-up operations to accommodate the different tier height for the relatively long wire bonds extending from the chip to the tiers of the multi-tiered cavity.

Typically, ceramic chip carrier substrates are also limited in heat dissipation capabilities. For example, in the case of a multilayer ceramic chip carrier having a chip positioned at the bottom of a multi-tiered cavity, heat dissipation is typically achieved by providing a heat sink directly beneath the cavity. This implies, however, that the heat generated by the chip must necessarily be conducted through the ceramic layer at the bottom of the cavity before reaching the heat sink. As a consequence, the rate of heat dissipation is limited.

The present invention, as defined herein, teaches an improved method for making a circuitized substrate capable of overcoming the aforementioned drawbacks of other such products. This method is uniquely adaptable for use with many existing manufacturing apparatus (e.g., wire bond and photoimaging equipment) without extensive alteration thereof and can thus be used on a mass production basis to enjoy the benefits thereof.

Different methods for making circuitized substrates are described in U.S. Pat. Nos. 5,022,960 (Takeyama et al), 5,142,448 (Kober et al), 5,144,534 (Kober) and 5,288,542 (Cibulsky et al). In U.S. Pat. No. 5,022,960, a laser beam is used to remove a selected portion of a substrate (12) which eventually accommodates a semiconductor chip (20) positioned on a metal layer (11) also attached to the substrate. In U.S. Pat. No. 5,142,448 there is described the step of compression molding several dielectric layers to form a laminate. Flexibility of certain parts of the board is attained by provision of slots, and a "plug" is located for occupying the defined flexible region. In U.S. Pat. No. 5,144,534, a method of making rigid-flexible circuit boards is described in which a removable plug is used in the PCB during processing and then removed. And, in U.S. Pat. No. 5,288, 542 (assigned to the same assignee as the present Application), another method is described for making a rigid-flexible circuit board in which a release layer (6) is used during processing and subsequently removed.

The above four patents fail to particularly overcome many of the aforementioned difficulties regarding known processes while assuring the higher densities mandated in today's technology.

It is believed, therefore, that a method of making a circuitized substrate which overcomes the above disadvantages and which can be performed in a facile and relatively inexpensive manner would represent a significant advancement in the art. It is further believed that providing such a method which will further enhance the unique process defined in U.S. Pat. No. 5,599,747 will also represent a significant art advancement.

As defined herein, such a method will result in a circuitized substrate capable of: (1) exhibiting relatively high electrical signal propagation speeds; (2) accommodating relatively high I/O chips; (3) exhibiting relatively short "time of flight" electrical signal speeds (including over the product defined in U.S. Pat. No. 5,599,747; and (4) exhibiting a relatively high rate of heat dissipation.

DISCLOSURE OF THE INVENTION

It is, therefore, an object of this invention to provide a method of making a circuitized substrate capable of being used as a chip carrier assembly which can be performed in a facile and relatively inexpensive manner in comparison to existing carrier manufacturing processes.

It is a more particular object of the invention to provide such a process which is readily adaptable to existing manufacturing equipment without extensive modification thereof In accordance with one aspect of this invention, there is defined a method of making a circuitized substrate comprising the steps of providing an electrically insulative base member having first and second opposing surfaces, removing preselected portions of the base member to form at least one slot extending entirely through the base member and defining a temporary support portion within the insulative base member, applying photoimaging material on the first opposing surface of the base member, including over the temporary support portion and the slot extending through the base member, exposing and developing selected portions of the photoimaging material to define a pattern within the photoimaging material, metallizing at least part of the first surface of the base member and the at least one slot, applying a removable film layer onto the patterned photoimaging material, removing additional portions of the base member to thereby remove the temporary support portion and define an opening having sidewalls extending entirely through the base member (at least part of the sidewalls not having metallizing thereon), metallizing the sidewalls of the opening, removing the removable film layer from the metallized first surface, metallizing the sidewalls of the opening and the metallized first surface, and removing the remaining portions of the photoimaging material from the substrate.

BRIEF DESCRIPTION OF THE DRAWINGS

FIGS. 1–6, 7A, 7B, and 8–17 represent the various steps of making a circuitized substrate in accordance with a preferred embodiment of the invention.

BEST MODE FOR CARRYING OUT THE INVENTION

For a better understanding of the present invention, together with other and further objects, advantages and capabilities thereof, reference is made to the following disclosure and appended claims in connection with the above-described drawings.

As understood from the following, the invention defines a method of making a circuitized substrate (and the resulting chip carrier) in which the resulting chip carrier is particularly designed to accommodate wire bond-type chips. The carrier produced in accordance with the teachings herein is capable of: (1) exhibiting relatively high electrical signal propagation speeds; (2) accommodating relatively high I/O chips; (3) avoiding the need for multiple manufacturing set-up operations heretofore associated with multi-tiered wire bond packages (as well as achieving a relatively short "time of flight" for electrical signals propagating through the wire bonds); and (4) assuring a relatively high rate of heat dissipation. In particular, the chip carrier produced in accordance with the preferred method taught herein achieves relatively high electrical propagation speeds because it employs organic materials, such as fiberglass-reinforced epoxy resins (in the trade also referred to as "FR4"), polytetrafluoroethylene (e.g., Teflon), etc. in lieu of ceramic materials. (Teflon is a trademark of E.I. duPont deNemours.) The resulting chip carrier also accommodates relatively high I/O count chips because it uses at least one organic photo-imageable dielectric layer in which photo-vias may be formed to electrically interconnect two (or more) layers of fan-out circuitry. The resulting chip carrier achieves a relatively short "time of flight" for electrical signals propagating through the wire bonds. The invention may further provide enhanced heat sinking for such a structure through the attachment of a sound heat conductor (e.g., copper sheet) to one side of the substrate and placement of the chip (or chips) in thermal contact therewith.

Figure 1:
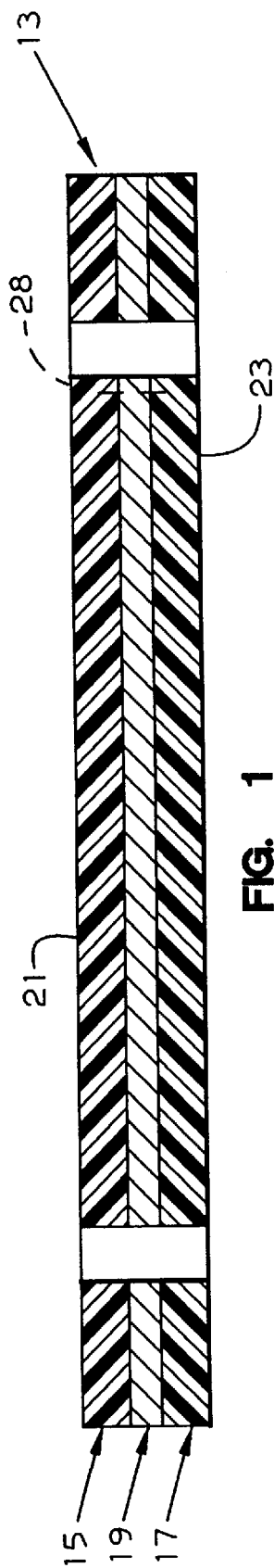

In FIG. 1, there is shown an electrically insulative base member 13 which may be used in the present invention to produce a chip carrier product (described below). It is understood that the invention is not limited to the particular configuration shown in FIG. 1, as others are readily possible. Base member 13 includes first and second dielectric layers 15 and 17 which sandwich therebetween a conductive layer 19. In a preferred embodiment, each of the two dielectric layers is comprised of fiberglass reinforced epoxy resin (often referred to in the industry simply as "FR4") and each possess a thickness of from about 2 mils (thousandths) to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent optimum package electrical performance.

Sandwiched between dielectric layers 15 and 17 is at least one conductive layer 19, preferably of copper or other well-known conductive material and possessing a thickness of preferably within the range of about 0.125 mils to about 2.5 mils. The thicknesses for layer 19 of less than 0.125 mils may prove undesirable should the resulting structure be subjected to relatively high temperatures. Additionally, thicknesses greater than 2.5 mils may prove undesirable because of the additional time necessary to form such layers using conventional plating techniques and associated difficulties with line width control.

The resulting structure shown in FIG. 1 thus preferably possesses a thickness within the range of only about 4.125 mils to about 42.5 mils. More preferably, a thickness of about 24 mils is used.

Dielectric layers 15 and 17 are bonded to the conductive layer 19 using a lamination process, such a process known in the art and further description is not believed necessary.

Base member 13 is thus shown to include at least two opposing surfaces 21 and 23. Although two dielectric layers are shown for base member 13, it is understood that the invention is not limited thereto. Specifically, it is only necessary to provide one such layer while still attaining the advantageous results taught herein. At least two layers are used when it is desired to incorporate an internal conductive plane (e.g., power, ground or signal) as part of the final structure. Understandably, several dielectric layers and corresponding internal conductive layers may be utilized, depending on operational requirements for the finished product.

Figure 2:
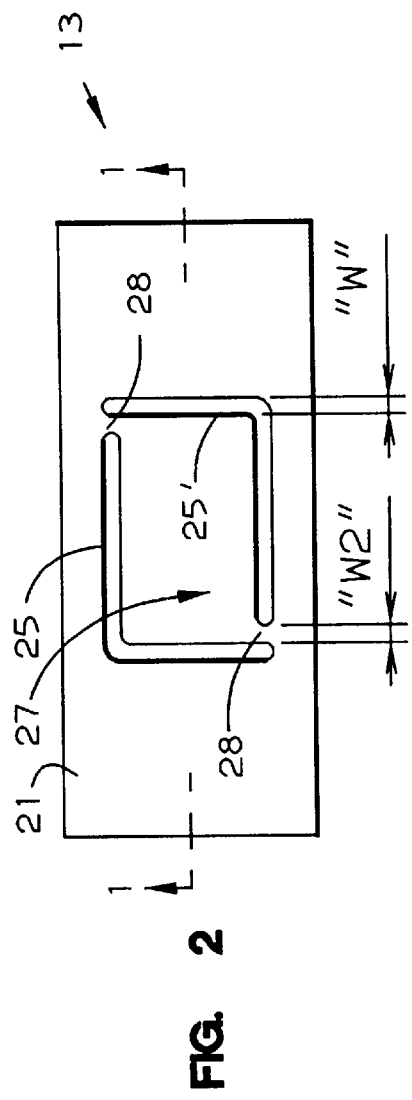

In FIG. 2 (a plan view of the base member 13 of FIG. 1 but on a smaller scale for illustration purposes), a pair of L-shaped slots 25 and 25' are formed within member 13. As understood, these slots serve to substantially define the ultimate boundaries of an opening (described below) to be provided in member 13 such that the member can accommodate a semiconductor chip positioned within this opening and electrically coupled to circuitry (described below) of member 13. As seen in FIG. 2, these slots 25 and 25' define a substantially rectangular (e.g., preferably square) portion 27 within base member 13, which hereinafter will be referred to as a temporary support portion.

Although a substantially rectangular shape is shown for temporary support portion 27 in the plan view of FIG. 2, other shapes are readily possible, depending on the ultimate chip configuration and the method of coupling this chip to base member 13. In one example, the resulting opening (51, FIGS. 9–16) of this support portion possessed (when removed) width and length dimensions each within the range of about 500 to about 700 mils, with each of the slots 25 and 25' possessing an average width ("W" in FIG. 2) of only about 60 mils.

In the broader aspects of the invention, it is possible to provide only a singular slot within member 13 (e.g., to define a substantially cylindrical support portion) thereby allowing only one non-removed segment.

The preferred means for providing slots 25 and 25' is to use a routing process using equipment known in the art, further description thus not believed necessary. In one embodiment, the two non-removed parts 28 each possessed a width ("W2" in FIG. 2) of only about 40 mils. (Notably, the slots 25 and 25' are shown in larger scale in FIGS. 1 and 3–8, again for illustration purposes.)

Figure 3:
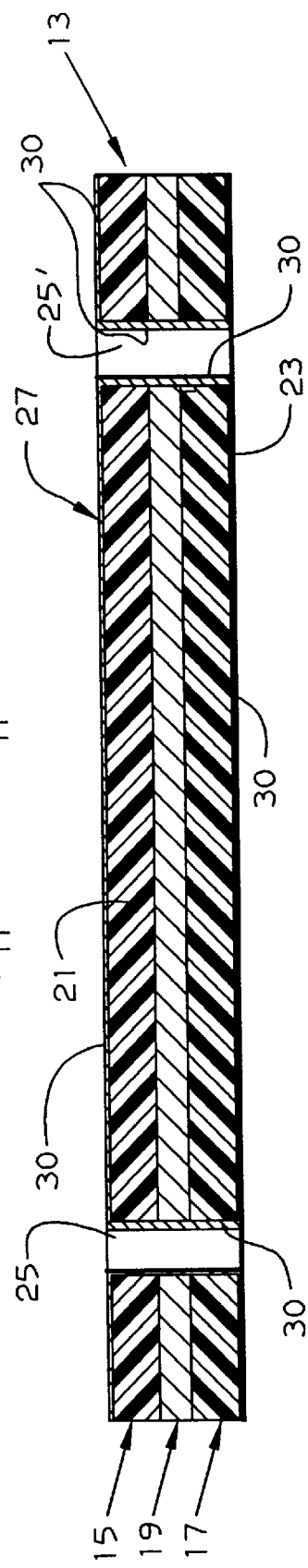

In the next step (FIG. 3), it is preferred to provide a metallized, thin seed layer on the surfaces 21 and 23 of base member 13, and also on the internal surfaces of individual slots 25 and 25'. As seen in FIG. 3, this thin seed layer (30) material extends through the entire thickness of member 13. The preferred material for the seed layers 30 is palladium-tin. Understandably, the described seed layer serves to enhance subsequent positioning of the invention's conductive circuitry (described below). By the term "thin" as used herein is meant a thickness for seed layer 30 within the range of about 40 to 60 angstroms.

As mentioned above, a key attribute of the present invention is its adaptability to many existing technologies, e.g., those used in mass production, by allowing the invention as defined herein to benefit from the several advantages thereof. One particular process involves what is referred to as a dry film resist operation in which the photoresists used are applied in dry film form (as opposed to liquid film application, another known process). Typically, such films are removed from supply rollers and aligned with respective surfaces of the substrates being treated. Such a process has become widely accepted in the field, and further description is not believed necessary.

In FIG. 4, two layers 31 and 31' of dry film photoimaging (photoresist) material are shown as being positioned on the respective surfaces of member 13. In one example, each layer of photoresist possessed a thickness of only from about 0.6 mils to about 2.0 mils. A preferred material is a negative-acting photoresist, various examples being known in the art, including Photoresist 3120 and Photoresist T168, both available from the E.I. duPont deNemours Corporation under these trade designations. Negative-acting photoresists, when applied and exposed through a suitable photomask, undergo a physical and chemical change in the exposed areas that render these areas insoluble to the subsequent developing solution which is to be applied thereto. Following exposure, the resist-coated base member 13 is immersed in this developing solution (e.g., sodium carbonate, propylene carbonate), which allows the unexposed areas to be removed without excessive impact on the hardened, exposed area. Baking or other processes may be used to further harden the remaining, exposed portions, if desired. Positive-acting photoresists are also possible for use in this invention.

In FIG. 5, base member 13 is shown following the above exposure and removal (developing) operations. As such, only portions of each photoresist layer 31 and 31' remain, these portions defining a pattern. These portions are represented by the numerals 33 (those on the upper surface) and 33' (those on the lower surface). It is understood that the removed portions of the photoresist in turn result in openings (35) which, in turn, expose preselected areas on the respective surfaces on which circuitization is to eventually occur. Thus a predetermined pattern on both surfaces is provided.

Significantly, the photoresist 31 and 31' was applied across the entire surfaces of member 13, including over the 60 mil wide slots 25 and 25' and the upper and lower surfaces of temporary support portion 27. These film (sheetlike) layers of photoresist are able to bridge the L-shaped slots 25 and 25' without bowing or otherwise extending within the slots. Heretofore, when larger openings (e.g., 500 mils×500 mils) were provided in the base member 13, such dry film photoresists were incapable of spanning ("tenting") the relatively large widths of such openings. The undesirable result was a sagging or similar disfiguration of the photoresist, rendering subsequent processing extremely difficult and often impossible. Further, the use of such a large spanning photoresist layer resulted in what may be described as "doubling over" of the resist when subjected to the subsequent developing operations in which various relatively high spray pressures of the developer are used, spraying being the preferred technique for providing such developer. As a result, inadequate development processes resulted with photoresist residues occasionally remaining on the parts to in turn result in unacceptable product yield rates. Previous attempts to minimize this problem through the adjustment of the exposure pattern for the photoresist or to reduce these pressures in the development step proved unsuccessful in providing consistent improvement. Photoresist layers 31 and 31' are shown as easily bridging (spanning) the respective slots 25 and 25' in FIG. 4, such that the aforementioned problems are eliminated.

As mentioned, although a negative-acting photoresist procedure has been described, the invention is not limited thereto. It is also possible to instead use positive-acting photoresists in which the exposed areas thereof under the photomask, when immersed in the developing solution, are removed. Such photoresists may also be applied in film (sheetlike) form, as are negative-acting photoresists. It is thus seen that the present invention is adaptable to more than one accepted technology.

Figure 6:
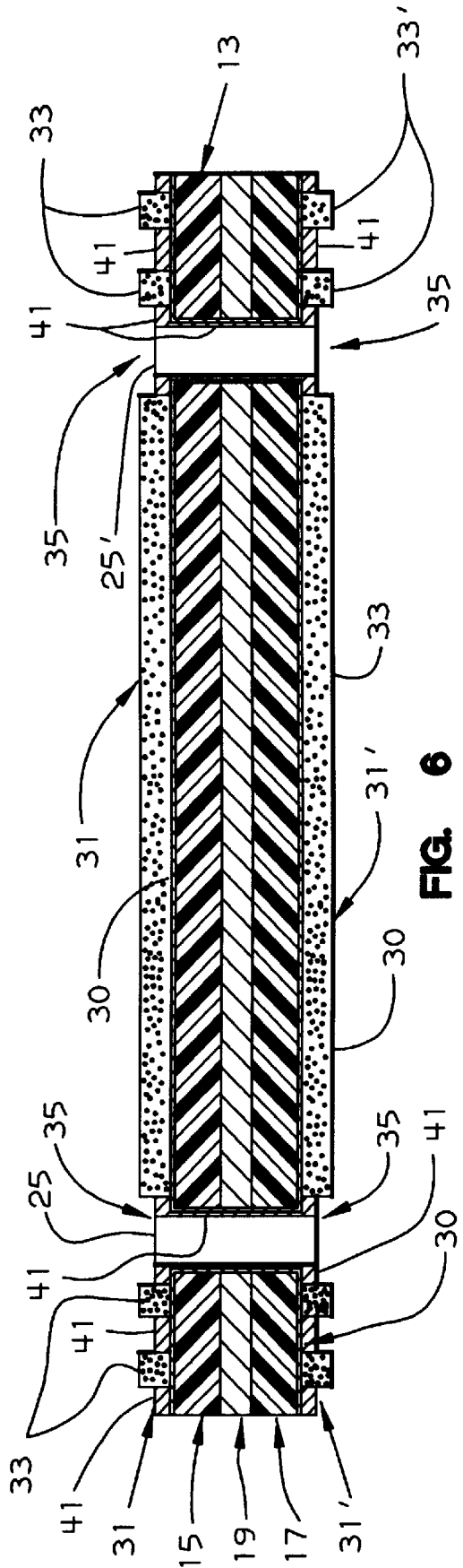
Figure 7:
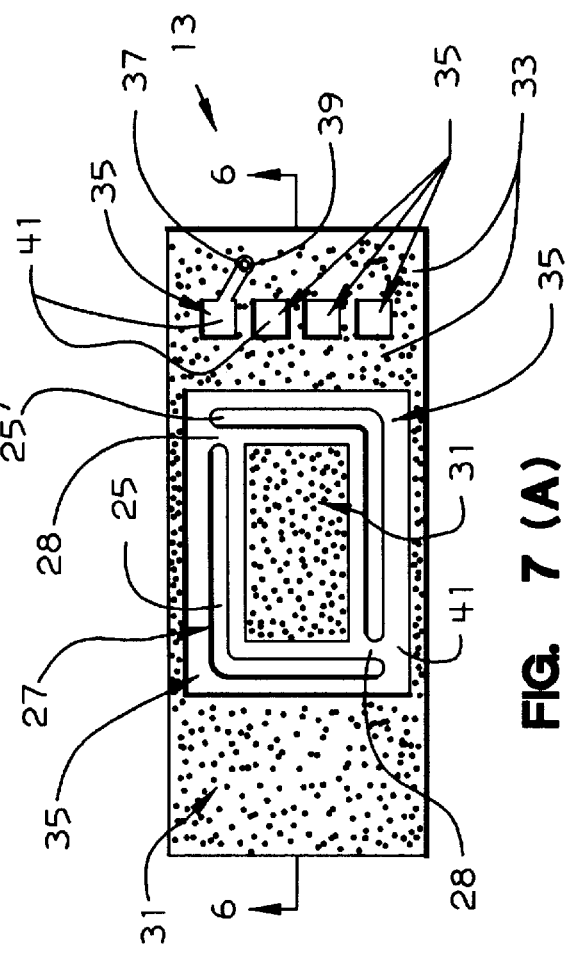
Figure 7:
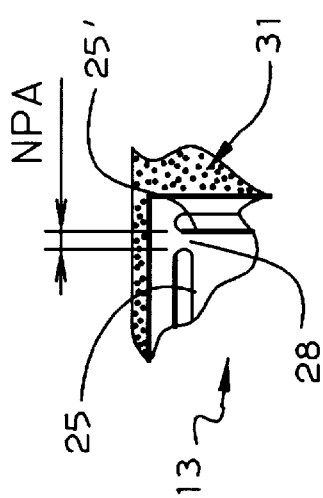

FIG. 6 illustrates a plan view, on a reduced scale, of the base member of FIG. 7(A), FIG. 6 being taken along the lines 6—6 in FIG. 7A. The respective exposed areas 35 within the photoresist (31 only shown in FIG. 7(A)) are clearly seen in FIG. 6. In one example, the exposed areas 35 shown to the right in FIG. 6 serve to expose contact pad areas (see below) for use in the final product. Significantly, the areas immediately above the respective slots 25 and 25' are also developed away to thereby expose these slots. (The other exposed areas 35 on the base member 13 are also shown in FIG. 7(A).

In addition to the exposed pad sites 35 and the slot locations 25 and 25', it is also possible to expose one/more areas on member 13, depending on the operational requirements for the final product. In FIG. 7(A), one example of such an area is shown and represented by the numeral 37. This area is designed to expose a land segment which in turn surrounds a through-hole 39 (not shown in FIGS. 1–6) which, when rendered conductive (e.g., plated), may serve to interconnect upper and lower layers of circuitry and also internal conductive planes (e.g., 19), if desired.

It is understood that the exposed areas illustrated in FIGS. 6 and 7(A) are shown for illustration purposes only and do not limit the invention to those as shown in the scale and relative sizes depicted. Specifically, in one example of the invention, a total of about 370 pad sites 35 can be provided, in addition to about 350 through-hole sites 37 (all of these, of course, in addition to the exposed area above slots 25 and 25').

In FIGS. 6 and 7(A), member 13 has been subjected to a metallization process in which copper or similarly conductive metal 41 is deposited in the exposed portions (e.g., sites 35 and 37) remaining following development and removal of the desired portions of photoresist 31 and 31'. In a preferred embodiment, this metallization (which will form at least part of the circuitry for member 13) is deposited using a plating process, and more preferably an additive plating process. Additive plating is well known in the art and further description is not believed necessary. This process is also referred to in the art as a wet copper plating process. Other plating and/or photolithographic techniques may of course be utilized in place of those mentioned above. For example, positive acting photoresists (as mentioned above) and negative acting photoresists used in conventional subtractive circuitization processes may be used. It is understood that either electroplating or electroless plating may be used to form the circuitry in accordance with the teachings of the present invention. In one embodiment, the deposited copper 41 on the upper and lower surfaces of member 13 and within the slots 25 and 25' may possess a thickness of only from about 0.5 mils to about 2.0 mils, the plated copper within the elongated slots 25 and 25' being substantially the same thickness. The aforementioned palladium-tin seed layer 30 is, understandably, covered by metallization 41 and thus not seen in FIG. 7(A). It is understood, however, that this layer is present and has remained on the exposed surfaces of member 13 following removal of the developed photoresist 31 and 31'.

In FIG. 7(B), a partial plan view of member 13 is shown, depicting a respective end portion of each of the two slots 25 and 25'. These end portions define the aforementioned interim, solid connect portion 28 which, understandably, extends through the entire thickness of member 13. The width of portion 28 is illustrated as "NPA" in FIG. 7(A), meaning that this thickness is presently a non-plated quantity of material of member 13's dielectric layers 15 and 17.

In FIG. 8, a second layer of dry film photoresist 50 is applied over the entire surface of member 13. A layer 50' also covers the member's undersurface. The material can be blanket exposed for better handling and for transportability into regular light areas. The Mylar coating on the photoresist, if used, remains in place. (This coating is not seen in FIG. 8.) Photoresist 50 and 50' is preferably of the same material as photoresist 31 and 31'. Photoresist 50 and 50' primarily contact and temporarily bond to the upper surfaces of the pattern of photoresists 31 and 31', respectively. This second resist material, as defined below, is relatively easily removable while also functioning as a mask during subsequent processing. In one embodiment, photoresist layers 50 and 50' each possess a thickness of only about 1.0 mil.

In FIG. 9, the temporary support portion 27 of member 13 has been entirely removed, thereby leaving the illustrated opening 51 therein. This removal process is preferably accomplished using a second routing procedure (and preferably the same routing equipment used to provide initial slots 25 and 25') which simply extends the respective ends of these slots to remove all of the initially non-removed material (27' in FIG. 2). As a result, the temporary support portion is removed, such that opening 51 will include a plurality of partially plated internal side walls (53 in FIG. 9). Such plating may be desirable to interconnect the opposing conductive layers on both upper and lower surfaces of member 13. If desired, these conductive layers may also be electrically coupled to an edge portion of one or more of the internal conductive planes (e.g., 19) to thereby provide a ground for selected portions of the respective circuit layers assuming these conductive layers function in this capacity. At this point, the material which forms the temporary interim connect portion 28 has been removed, leaving an exposed channel surface 42' having a width "NPA", which is understandably similar to the width "W2" in FIG. 2. Removal of temporary support portion 27 thus means there are at least two non-plated areas which extend from member 13's upper surface to its lower surface at this phase of the invention. Absent any plating, these exposed dielectric surfaces are thus non-conductive. Electrical performance and impedance are affected by not having completely conductive surface. This is unacceptable because subsequent routing may leave burrs and exposed copper, there can be worsened impedance problems if burr is pulled back too far exposing more dielectric surface, especially if the nonconductive area already makes the surface marginally non-conductive. There is exposure to downstream wet processes which can present a reliability issue. Also, this step reduces epoxy adhesive bleed into the cavity, and, lastly, aids in providing a ground connection.

Significantly, in FIG. 10 the exposed surfaces of the entire structure, including the exposed, non-covered channel surface 42', are seeded with a catalyst (e.g., palladium, Ni, etc.) That is, a layer 52 of metallization substantially covers the exposed areas of remaining photoresist 50 and 50' and metallization layer 41 which is exposed to new opening 51. This metallization does not cover the external surfaces of layer 41 covered by photoresist 50 and 50', thereby saving material.

In FIG. 11, the remaining portions of photoresist material 50 and 50' have been removed. A preferred step for completing such removal is to simply mechanically strip the remaining portions. Alternatively it is also possible to remove the photoresist 50 and 50' using known chemical means. The resulting structure in FIG. 11 thus includes an exposed conductive surface 41 on areas of member 13 spaced from the internal opening 51. Opening 51 also includes the conductive layer of metallization 52 thereon which, as described, also covers the previously non-plated channels 42', only one of these channels now shown hidden in FIGS. 10 and 11. The entire internal surface of opening 51 is thus understood to be covered with a conductive layer of metallization and thus a solid conductive path from the invention's top surface to the bottom surface with respect to the conductive layers 41. More specifically, in FIG. 11, this layer of metallization 52, is directly positioned on the underlying metallization 41.

In FIG. 12, member 13 has received another layer of metallization 54, preferably by plating (e.g., additive), said metallization 54 "filling" the open areas of member 13 defined by the upwardly projecting elements 33 and 33' of the first photoresist. The previously exposed portions of layer 41 between these photoresist projections are thus covered with this additional layer of metallization 54 such that the overall thickness of each conductive portion formed at this location of the invention is now about 0.5–0.8 mils. Similarly, the thickness for all of the layers of metallization defining the surrounding internal opening 51 are about 1.0 mil thick. Clearly, the previously unplated surfaces 42' of the members 28, one shown hidden in FIGS. 12–14, have received an even thicker layer of metallization thereon, thereby enhancing the conductive path between the opposing upper and lower surfaces of member 13. The preferred method for applying this latest layer of metallization 54 is additive plating, albeit other methods of deposition may be used.

In FIG. 13, the remaining portions of photoresist elements 33 and 33' are removed. A preferred step for doing so is to use a solution similar to the developing solution (e.g., sodium carbonate, propylene carbonate, benzyl alcohol) but at an elevated temperature compared to developing conditions. Such removal leaves exposed portions of the first layer of metallization 30 between the respective conductors formed by the two metallizations 41 and 54. These conductors may be in the form of extended signal lines, small size diameter conductor pads, etc. In the embodiment of FIG. 13, such electrically conductive elements are understandably electrically connected by the initial metallization layer 30, which, of course, would be unacceptable for subsequent product operation.

Consequently, in FIG. 14, the remaining exposed portions of metallization 30 have been removed. A preferred process for effecting such removal is to use a solution that complexes with palladium/tin preferentially. One method well known in the industry is to use a solution containing a cyanide salt at a concentration high enough to complex the available palladium/tin. The result is a plurality of conductive elements (of three metal layers 30, 41 and 54) in the form of lines and/or pads on the outermost, external surfaces of member 13, these elements substantially surrounding the internal positioned opening 51 which, as understood, is entirely conductive. In one embodiment of the invention, these conductive elements may possess a width of only about 0.5 to 5.00 mils, while it is possible utilizing the teachings of the present invention to provide conductive lines having a length of at least 0.25 mil to 100 mils.

At this point, it may also be desirable to selectively apply precious metal (e.g., gold) 60 (FIG. 15) to various parts of the respective conductive elements formed on the upper and lower surfaces of member 13. Such application is preferably performed by an additive plating process, several types of which are known in the art, a preferred process being electroless plating. Such additional plating is particularly desired for those surfaces of the circuitry designed to receive the highly conductive, fine wires (described below) which will eventually couple a semiconductor chip (also described below) to this circuitry. Using suitable masking, it is possible to only selectively plate the invention's outer conductors and thereby exclude plating the relatively large internal opening 51.

In the event that it is desired to provide a heat sinking and/or stiffening member, such a member, represented by the numeral 61 in FIG. 16, may be simply bonded to the bottom surface (including the respective conductors 41 if present) of member 13. In one embodiment, this member 61 was comprised of a 14 mil thick copper sheet which was secured to member 13 using an epoxy-based adhesive represented by the numeral 63. Several adhesives are possible, as are several different metals (e.g., aluminum) for member 61.

(Although a second, bottom electrically conductive layer is shown in the embodiments depicted herein, it is understood that, in its broadest aspects, the invention may only utilize a singular, upper conductive layer. Should this be the situation, the heat sink and/or stiffener 61 would understandably be directly attached to the lower surface of the bottom dielectric layer 17.)

The member 13 in FIG. 14 is now ready to receive an integrated circuit (semiconductor) chip, such as shown in FIG. 17 (the chip represented by the numeral 71). Preferably, chip 71 is bonded to the heat sinking and/or stiffening member 61 using a second adhesive (not shown), a preferred adhesive being of the thermally conducting type which, in a preferred embodiment, is a commercially available silver-impregnated epoxy sold under the trade designation Ablebond 9651-L by Ablestick Corporation. Adhesive 63 is shown in FIGS. 16 and 17 and can also be used to bond chip 71 in place. Should a different adhesive be preferred, however, adhesive 63 would only lie between member 61 and member 13's undersurface at locations other than below opening 51. Such adhesive could be simply positioned on an exposed upper surface of member 61 below the opening. Chip 71 is thus thermally coupled to member 61 to assure enhanced heat removal from the final package structure as produced in accordance with the teachings herein. Bond wires 75 (e.g., gold) may now be provided to electrically couple contact sites 77 on the chip's upper surface to corresponding respective ones of the external conductive members which form the upper layer of circuitry for member 13. As seen in FIG. 17, these wires extend from the chip outwardly to this circuitry. The wires 75 are preferably provided using a wirebond process, well known in the art.

If desired, an encapsulant material (not shown) may be provided over the wires and associated pads to provide protection from the occasionally harsh environment to which the product produced by the invention may be exposed. One suitable encapsulant is an epoxy molding material sold by the Dexter-Hysol Company under the trade name Hysol 4450.

FIG. 17 thus illustrates a chip carrier structure which is now capable of being electrically coupled to additional circuit structures (e.g., printed circuit boards) which form part of a larger information handling system (computer) for which the product produced by the invention is particularly suited. One such form of coupling may include solder ball attach in which solder balls (e.g., 90:10 tin:lead) are used to couple respective parts of member 13's circuitry to the circuitry on one/more of such additional circuit structures. Other techniques are of course readily possible for achieving this end.

Thus there has been shown and described a facile method for producing a circuitized substrate for use as part of a chip carrier assembly which is capable of being readily performed using many established processes of the art. The invention thus represents a relatively inexpensive yet effective process for producing chip carrier structures on a mass scale. While the invention has been described with respect to organic dielectric materials, this is not meant to limit the invention in that even inorganic (e.g., ceramic) may be utilized to provide the dielectric function. As stated above, it is also readily possible to utilize alternative procedures (e.g., subtractive circuitization) which are also known in the art, to accomplish the invention.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising the steps of:

providing an electrically insulative base member having first and second opposing surfaces;

removing preselected portions of said base member to form at least one slot extending entirely through said base member and defining a temporary support portion within said insulative base member;

applying photoimaging material onto said first opposing surface of said base member, including over said temporary support portion and said slot extending through said base member;

exposing and developing selected portions of said photoimaging material to define a pattern of said photoimaging material remaining on said base member;

metallizing at least part of said first surface of said base member and said at least one slot;

applying a removable film layer substantially onto said pattern of said photoimaging material remaining on said base member;

removing additional portions of said base member to thereby remove said temporary support portion and define an opening having sidewalls extending entirely through said base member, at least part of said sidewalls not having metallizing thereon;

metallizing said sidewalls of said opening, including said part of said sidewalls not having metallizing thereon;

removing said removable film layer;

metallizing said sidewalls of said opening and said metallized first surface; and removing the remaining portions of said photoimaging material from said substrate.

2. The method of claim 1 wherein said preselected portions of said base member are removed using a routing process.

3. The method of claim 2 wherein said removing of said additional portions of said base member is accomplished using a routing process.

4. The method of claim 1 further including the step of metallizing said first opposing surface of said base member prior to said applying of said photoimaging material.

5. The method of claim 1 wherein said metallizing of said at least part of said first surface and said at least one slot of said base member is accomplished using a plating process.

6. The method of claim 5 wherein said plating process is an additive plating process.

7. The method of claim 1 wherein said exposing and developing said selected portions of said photoimaging material is accomplished using a masking process.

8. The method of claim 1 wherein said photoimaging material is applied onto said first opposing surface of said base member and over said slot in sheetlike form.

9. The method of claim 1 further including the step of applying precious metal material onto selected regions of said metallized first surface of said base member.

10. The method of claim 1 further including securing a heat sinking and/or stiffener member to said base member along said second opposing surface.

11. The method of claim 10 wherein said securing of said heat sinking and/or stiffener member is accomplished using an adhesive.

12. The method of claim 10 further including the step of positioning an integrated circuit member within said opening extending through said base member.

13. The method of claim 12 further including positioning said integrated circuit member on said heat sinking and/or stiffener member.

14. The method of claim 12 further including the step of electrically coupling said integrated circuit member to selected areas of said metallizing on said first surface of said base member.

15. The method of claim 14 wherein said electrical coupling is accomplished using a wire bonding process.

16. The method of claim 1 wherein said metallizing of said sidewalls of said opening including said part of said sidewalls not having metallizing thereon further includes the step of metallizing at least part of said removable film layer.

17. The method of claim 1 further including providing a first metallized, thin layer onto said at least one slot and said temporary support portion prior to said applying of said photoimaging material onto said first opposing surface of said base member, said temporary support portion and said slot extending through said base member.

18. The method of claim 17 further including removing all exposed areas of said first metallized, thin layer following said removing of said remaining portions of said photoimaging material.

19. The method of claim 18 further including applying a layer of precious metal onto said metallizing on said sidewalls of said opening and said metallized first surface.

20. The method of claim 1 further including providing a conductive layer within said electrically insulative base member between said first and second opposing surfaces, said conductive layer including an exposed edge portion within said slot extending entirely through said base member.

21. The method of claim 20 wherein said metallizing of said slot and said at least part of said first surface further includes the step of metallizing said exposed edge portion of said conductive layer.

\* \* \* \* \*